(12) United States Patent
Yano et al.

(10) Patent No.: US 8,546,815 B2
(45) Date of Patent: Oct. 1, 2013

(54) SIC SEMICONDUCTOR ELEMENT AND MANUFACTURING METHOD FOR SAME

(75) Inventors: Hiroshi Yano, Nara (JP); Dai Okamoto, Nara (JP)

(73) Assignee: National University Corporation Nara Institute of Science and Technology, Nara (JP)

( * ) Notice: Subject to any disclaimer, the term of this patent is extended or adjusted under 35 U.S.C. 154(b) by 0 days.

(21) Appl. No.: 13/516,054

(22) PCT Filed: Dec. 13, 2010

(86) PCT No.: PCT/JP2010/007231
§ 371 (c)(1),
(2), (4) Date: Jun. 14, 2012

(87) PCT Pub. No.: WO2011/074237
PCT Pub. Date: Jun. 23, 2011

(65) Prior Publication Data
US 2012/0241767 A1      Sep. 27, 2012

(30) Foreign Application Priority Data

Dec. 16, 2009 (JP) .................................. 2009-285561
Dec. 13, 2010 (JP) ..................... PCT/JP2010/007231

(51) Int. Cl.
*H01L 31/0312* (2006.01)
(52) U.S. Cl.
USPC .................................... 257/77; 257/E23.118
(58) Field of Classification Search
USPC .................... 257/77, 405, E23.118, E29.297, 257/E29.298
See application file for complete search history.

(56) References Cited

U.S. PATENT DOCUMENTS

| | | | |
|---|---|---|---|
| 6,713,359 B1 | 3/2004 | Mizushima et al. | |
| 7,745,276 B2 | 6/2010 | Okuno et al. | |
| 7,811,874 B2 * | 10/2010 | Harada et al. | 438/198 |
| 7,824,995 B2 | 11/2010 | Endo et al. | |
| 8,133,787 B2 | 3/2012 | Endo | |

FOREIGN PATENT DOCUMENTS

| | | |
|---|---|---|
| JP | 2000-150866 A | 5/2000 |
| JP | 2002-185015 A | 6/2002 |
| JP | 2002-222950 A | 8/2002 |
| JP | 2003-086792 A | 3/2003 |
| JP | 2004-244456 A | 9/2004 |

(Continued)

OTHER PUBLICATIONS

International Search Report, PCT/JP2010/007231, Apr. 12, 2011, 2 pages.

*Primary Examiner* — Quoc Hoang
(74) *Attorney, Agent, or Firm* — Ogilvie Law Firm

(57) ABSTRACT

Disclosed are an SiC semiconductor element and manufacturing method for an SiC semiconductor element in which the interface state density of the interface of the insulating film and the SiC is reduced, and channel mobility is improved. Phosphorus (30) is added to an insulating film (20) formed on an SiC semiconductor (10) substrate in a semiconductor element. The addition of phosphorous to the insulating film makes it possible to significantly reduce the defects (interface state density) in the interface (21) of the insulating film and the SiC, and to dramatically improve the channel mobility when compared with conventional SiC semiconductor elements. The addition of phosphorus to the insulating film is carried out by heat treatment. The use of heat treatment to add phosphorous to the insulating film makes it possible to maintain the reliability of the insulating film, and to avoid variation in channel mobility and threshold voltage.

20 Claims, 13 Drawing Sheets

(56) References Cited

FOREIGN PATENT DOCUMENTS

| | | |
|---|---|---|
| JP | 2005-136386 A | 5/2005 |
| JP | 2006-216918 A | 8/2006 |
| JP | 2007-287992 A | 11/2007 |
| WO | 2007/096996 A1 | 8/2007 |

* cited by examiner

4H-SiC

POCl₃ anneal 1000°C

Channel length/width(L/W) = 10/200μm

POCl₃ anneal 1000°C
Channel length/width(L/W) = 30/200μm

POCl₃ anneal 1000°C
Channel length/width(L/W) = 50/200μm

POCl₃ anneal 1000°C
Channel length/width(L/W) = 100/200μm

Conventional technology

Dry/N2 : Dry oxidation + N2Anneal(not nitrided)   Mobility = 4 cm²/Vs
Dry/NO : Dry oxidation + NOAnneal(nitrided)   Mobility = 25 cm²/Vs
Channel length/width(L/W) = 30/200μm

SIC SEMICONDUCTOR ELEMENT AND MANUFACTURING METHOD FOR SAME

RELATED APPLICATIONS

The present application claims priority to the following applications: PCT/JP2010/007231 filed 13 Dec. 2010, JP 2009-285561 filed 16 Dec. 2009.

TECHNICAL FIELD

The present invention relates to a technology for reducing interface defects on an insulating film (oxide film) and an SiC semiconductor of an SiC semiconductor element and improving channel mobility of a MISFET (MIS field-effect transistor), a MOSFET (MOS field-effect transistor) or the like.

BACKGROUND ART

An SiC semiconductor is a semiconductor made of SiC (silicon carbide) which is a compound of carbon (C) and silicon (Si). A most distinctive feature of the SiC semiconductor is to have a physical value suitable as a material of semiconductor devices (power devices) used in power electronics. For example, in the case of commercially available single-crystal 4H-SiC, a band gap is 3.3 eV which is three times as wide as conventional Si-semiconductors, dielectric breakdown field strength is 3 MV/cm which is about ten times as high as conventional Si-semiconductors and saturation electron velocity is three times as fast as conventional Si-semiconductors. Further, SiC-semiconductors are better in thermal conductivity, heat resistance and chemical resistance than conventional Si-semiconductors and also have a feature of having a higher radiation resistance than Si-semiconductors. From these features, SiC-semiconductors, particularly MISFETs (MIS field-effect transistors) or MOSFETs (MOS field-effect transistors) of SiC are preferably used for semiconductor devices used in power electronics.

However, it has been conventionally problematic that there are many defects in an interface between a gate insulating film (gate oxide film) and SiC and channel mobility is low in MIS(MOS)FETs of SiC. Particularly, electron mobility in a bulk crystal is as high as 800 to 1000 $cm^2/Vs$ in 4H-SiC, whereas it has been a problem that the channel mobility (Si-face) of MIS(MOS)FETs of SiC is as low as 10 $cm^2/Vs$.

Further, conventionally, an insulating film has been formed by thermal oxidation of SiC or using a CVD method and an interface between the formed insulating film and SiC has been nitrided such as by NO, $N_2O$ or $NH_3$ gas, thereby reducing defects in the interface to improve the channel mobility. However, the channel mobility (Si-face) of the MIS(MOS)FET of SiC is as low as 40 to 50 $cm^2/Vs$ even if the interface is nitrided and a further improvement in the channel mobility is much-needed.

The channel mobility of the MIS(MOS)FET of SiC is low because there are many defects in the interface of SiC produced by conventional technologies, i.e. interface state density is high. Due to the low channel mobility of the MIS(MOS)FET of SiC, an on-resistance value of the MIS(MOS)FET transistor increases. If the on-resistance value of the transistor increases, power consumption increases.

As described above, despite the fact that the electron mobility in the bulk crystal is originally as high as 800 to 1000 $cm^2/Vs$ in 4H-SiC, the channel mobility is reduced due to defects (magnitude of the interface state density) if SiC is incorporated in devices such as a MIS(MOS)FET. That is, by device integration, the potential of SiC originally having a high electron mobility cannot be utilized at all.

Thus far, there have been known many prior arts for reducing an on-resistance of a transistor by improving the channel mobility of a MIS(MOS)FET. For example, there is known a manufacturing method for improving channel mobility by lower density or n-type conversion of a surface of a p-type layer through ion implantation of nitrogen or phosphorus into SiC immediately below a gate insulating film or epitaxial growth (for example, see patent literature 1). There is also known a manufacturing method for improving channel mobility by nitriding an interface between an insulating film and SiC (for example, see patent literature 2). There is further known a manufacturing method for improving channel mobility by performing a heat treatment on a gate insulating film (gate oxide film) in an atmosphere containing $H_2O$ (for example, see patent literature 3).

However, the above patent literature 1 has a problem that reliability of the insulating film provided on an SiC substrate is poor since nitrogen or phosphorus is ion-implanted into SiC immediately below the gate insulating film or the epitaxial growth is allowed. There is also a problem in controllability of impurity concentration and film thickness of epi-layer. Resulting from that, there is also a problem that the channel mobility and a threshold voltage vary.

Further, in the above patent literature 2, the channel mobility is about 40 $cm^2/Vs$ as described above although the interface state density is reduced and the channel mobility is improved by nitriding the interface. Further, in the above patent literature 3, the channel mobility is about 50 $cm^2/Vs$ although the channel mobility is improved by performing the heat treatment on the gate insulating film (gate oxide film) in the atmosphere containing $H_2O$. There is also a problem that an effective range of a process condition is narrow.

[Patent Document 1] JP 2000-150866 A
[Patent Document 2] JP 2006-216918 A
[Patent Document 3] JP 2003-086792 A

DISCLOSURE OF THE INVENTION

Problems to be Solved by the Invention

In view of the above situation, an object of the present invention is to provide an SiC semiconductor element, in which the interface state density of an interface between an insulating film in contact with an SiC semiconductor and SiC is reduced to improve channel mobility, and a manufacturing method therefor.

Means to Solve the Objects

As a result of a dedicated study, the present inventors found out interface defects (interface state density) of an insulating film and SiC could be drastically reduced and the channel mobility of a MIS(MOS)FET could be drastically improved by adding (doping) phosphorus to a gate insulating film itself by a heat treatment instead of implanting phosphorus into SiC immediately below the gate insulating film as had been conventionally done, and completed the present invention.

That is, to achieve the above object, the present invention is directed to an SiC semiconductor element, comprising at least an SiC semiconductor substrate; and an insulating film in contact with the substrate, the insulating film containing phosphorus. According to such a configuration, it is possible to reduce the interface state density of an interface between the SiC semiconductor substrate and the insulating film and improve the channel mobility of the semiconductor element.

By containing phosphorus in the insulating film, interface defects (interface state density) of the insulating film and SiC can be drastically reduced and the channel mobility of the semiconductor element can be dramatically better than before.

By containing phosphorus, a part of Si in the oxide film ($SiO_2$), which is the insulating film, is replaced by phosphorus (P) and phosphorus (P) is bonded to surrounding oxygen atoms (O) forming a network in 3-fold coordination. Si—Si bonds (O deficiency) present in $SiO_2$ are known to become defects. It is inferred that defects disappear by replacing such Si by phosphorus (P), whereby the interface defects (interface state density) of the insulating film and SiC can be reduced. Further, it is inferred to influence the disappearance of the defects that a part of Si (4-fold coordination) bonded to four surrounding oxygen atoms (O) is replaced by phosphorus (P), whereby bonding to the oxygen atoms (O) forming the network become 3-fold coordination and a strain of the oxide film is relaxed.

Note that the above insulating film only has to be formed on the interface with SiC and can be preferably applied to any crystal surface such as a silicon-face, a carbon-face and a side wall surface of SiC.

Here, the insulating film includes an oxide film and a nitride film.

In the above SiC semiconductor element of the present invention, specifically, the interface state density of an interface between the SiC semiconductor substrate and the insulating film is $1\times10^{11}$ $cm^{-2}$ $eV^{-1}$ or less when energy from a conduction band edge is in a range of 0.2 to 0.6 eV.

Preferably, in the above SiC semiconductor element of the present invention, the interface state density of the interface between the SiC semiconductor substrate and the insulating film is $5\times10^{11}$ $cm^{-2}$ $eV^{-1}$ or less when energy from the conduction band edge is in a range of 0.2 to 0.6 eV and the channel mobility of the semiconductor element is 35 $cm^2/Vs$ or more.

Further preferably, in the above SiC semiconductor element of the present invention, the interface state density of the interface between the SiC semiconductor substrate and the insulating film is $1\times10^{11}$ $cm^{-2}$ $eV^{-1}$ or less when energy from the conduction band edge is in a range of 0.2 to 0.6 eV and the channel mobility of the semiconductor element is 85 $cm^2/Vs$ or more.

Here, the above SiC semiconductor element of the present invention is preferably such that phosphorus is not present in an SiC semiconductor substrate part excluding low-resistance n+ type regions such as a source, a drain, a base, an emitter and a collector which serve as supply ports and discharge ports for electrons out of the SiC semiconductor substrate.

Further, from another perspective, phosphorus is preferably not added to the SiC semiconductor substrate by a heat treatment. This is because it leads to an increase in an impurity concentration of the SiC semiconductor substrate.

Further, from another perspective, the above SiC semiconductor element is preferably such that, in the case of including at least a MIS(MOS) channel, phosphorus is not contained in such a MIS(MOS) channel. This is because, in the case of a semiconductor element including a MIS(MOS) channel, phosphorus content leads to an increase in an impurity concentration of the MIS(MOS) channel.

In the above SiC semiconductor element of the present invention, preferably, phosphorus is added to the insulating film by a heat treatment and an impurity concentration of the SiC semiconductor substrate does not change.

Further, by adding phosphorus to the above insulating film by the heat treatment, phosphorus does not penetrate into SiC and an impurity concentration of SiC is not changed or an increase can be avoided. For example, in the case of including a MIS(MOS) channel, phosphorus does not penetrate into the MIS(MOS) channel and phosphorus as an impurity is not changed or increased in the MIS(MOS) channel.

By adding phosphorus to the insulating film using the heat treatment, reliability of the insulating film can be maintained and variations in the channel mobility and threshold voltage can be avoided.

Further, in the case of adding phosphorus to the insulating film by the heat treatment, phosphorus having reached the interface with SiC is hardly added to SiC. This is because a diffusion coefficient of phosphorus in SiC is very small. Thus, the impurity concentration (effective acceptor concentration or effective donor concentration) of SiC hardly changes, which also leads to avoidance of variations in the channel mobility and threshold voltage.

Further, in the above insulating film, phosphorus is more preferably present in the interface with SiC. This is because phosphorus is added to the insulating film by the heat treatment and the interface defects (interface state density) of the insulating film and SiC can be drastically reduced by phosphorus reaching up to the interface with SiC.

Specifically, in the above insulating film, the interface state density is more preferably $1\times10^{11}$ $cm^{-2}$ $eV^{-1}$ or less. This is because phosphorus is added to the insulating film by the heat treatment and reaches up to the interface with SiC, whereby, the interface state density, which has been conventionally about $1\times10^{12}$ $cm^{-2}$ $eV^{-1}$, can be reduced by about one digit.

Further, in the above insulating film, the density of phosphorus in the interface with SiC is more preferably $1\times10^{21}$ $cm^{-3}$ or more. This is because the interface defects (interface state density) of the insulating film and SiC can be drastically reduced by having a high density of phosphorus in the interface with SiC.

Further, in the above insulating film, a phosphorus concentration is uniformly distributed up to the interface with the SiC in a film thickness direction. This is because film quality can be made uniform.

Specifically, the above insulating film is preferably used as a gate insulating film.

This is because the channel mobility of a MIS(MOS)FET or the like can be improved, leading to a reduction in an on-resistance of a transistor by using the above insulating film as a gate insulating film since the interface defects of the insulating film and SiC can be reduced.

Besides, the above insulating film is preferably used as a surface passivation film.

This is because carrier recombination in the SiC surface, i.e. the interface between SiC and the insulating film is suppressed, which leads to a reduction in leakage current and an amplification factor improvement in bipolar transistors, thyristors and the like, by using the insulating film as the surface passivation film since the interface defects of the insulating film and SiC can be reduced.

Next, an SiC semiconductor element manufacturing method of the present invention is described.

The SiC semiconductor element manufacturing method of the present invention comprises at least the following (Step S10) and (Step S20).

(Step S10) An insulating film forming step of forming an insulating film on a semiconductor substrate made of SiC.
(Step S20) A phosphorus adding step of adding phosphorus to the insulating film by a heat treatment.

An insulating film forming method in the above (Step S10) ma-y be any existing known forming method and is not particularly limited.

Phosphorus is added to the insulating film by the heat treatment in the phosphorus adding step in the above (Step S20) to prevent phosphorus from being added to SiC. In the case of adding phosphorus to the insulating film by the heat treatment, phosphorus having reached the interface with SiC is hardly added to SiC. The reason for that is that a diffusion coefficient of phosphorus in SiC is very small. By not adding phosphorus to SiC, an impurity concentration (effective acceptor concentration or effective donor concentration) of SiC hardly changes, which leads to avoidance of variations in the channel mobility and threshold voltage.

Further, in the SiC semiconductor element manufacturing method of the present invention, it is preferable to further comprise the following (Step S15) and (Step S30).
(Step S15) An interface nitriding step of nitriding an interface and removing remaining carbon using a nitric oxide gas such as NO or $N_2O$ for the formed insulating film.
(Step S30) A terminating step of terminating dangling bonds using hydrogen anneal.

Further, in the SiC semiconductor element manufacturing method of the present invention, it is further preferable to include an inert gas annealing step (phosphorus diffusing step) (Step S25) of performing annealing using an inert gas after the phosphorus adding step in the above (Step S20).

For example, a nitrogen gas or an argon gas is preferably used as the inert gas.

This is because, by performing annealing using the inert gas after the phosphorus adding step, phosphorus is diffused into the insulating film and phosphorus can reliably reach up to the interface between the insulating film and the SiC semiconductor.

The order of the respective steps of the SiC semiconductor element manufacturing method of the present invention is not particularly limited. Preferably, after the insulating film forming step (Step 10), the steps are performed in an decreasing order of temperature from the one having a highest treatment temperature such as in the order of the interface nitriding step (Step 15), the phosphorus adding step (Step 20), the phosphorus diffusing step (Step 25) and the terminating step (Step 30). In this way, temperature management among the steps can be more easily carried out. Note that it is also possible to perform other steps or processes on the SiC semiconductor element between the respective steps.

Here, the phosphorus adding step in the above (Step S20) is specifically performed by performing the heat treatment on the insulating film at a temperature of 950 to 1100° C. in a mixed gas atmosphere of oxygen and an inert gas such as oxygen and nitrogen by bubbling a phosphoryl chloride ($POCl_3$) solution.

The bubbling of the phosphoryl chloride ($POCl_3$) solution is performed, for example, by bubbling the phosphoryl chloride ($POCl_3$) solution at normal temperature or lower using nitrogen. The heat treatment is performed in a temperature range of 950 to 1100° C. for 10 minutes in the atmosphere in which the bubbling gas, the oxygen gas and the nitrogen gas are mixed.

Further, after the above heat treatment, a heat treatment is subsequently performed at the same temperature in an inert gas atmosphere such as nitrogen for 10 minutes.

Note that, beside the above method, the phosphorus adding step in (Step S20) can also be performed by a heat treatment in an atmosphere using a phosphorus-containing gas such as phosphine ($PH_3$) and tertiary butyl phosphine (TBP) or a material obtained by evaporating a solution.

Further, in the SiC semiconductor element manufacturing method of the present invention, the phosphorus adding step in (Step S20) is further preferably performed by performing the heat treatment on the insulating film at a temperature of 800 to 1100° C. in a mixed gas atmosphere of oxygen and an inert gas by bubbling a phosphoryl chloride ($POCl_3$) solution and the inert gas annealing step in (Step S25) is performed at a temperature of 950 to 1100° C.

Effects of the Invention

According to the present invention, by performing the heat treatment on the insulating film using the phosphorus-containing gas, there is an effect of being able to drastically reduce interface defects (interface state density) of the insulating film and SiC and make the channel mobility dramatically better than before. By improving the channel mobility, there is an effect of reducing power consumption of a power device using the present invention. Further, a surface passivation film using the present invention has an effect of achieving a reduction in leakage current and an improvement in amplification factor.

BEST MODE FOR CARRYING OUT THE INVENTION

Hereinafter, an embodiment of the present invention will be described with reference to the accompanying drawings. The present invention is not limited to the illustrated construction. The present invention can be variously changed in design.

Figure 1:
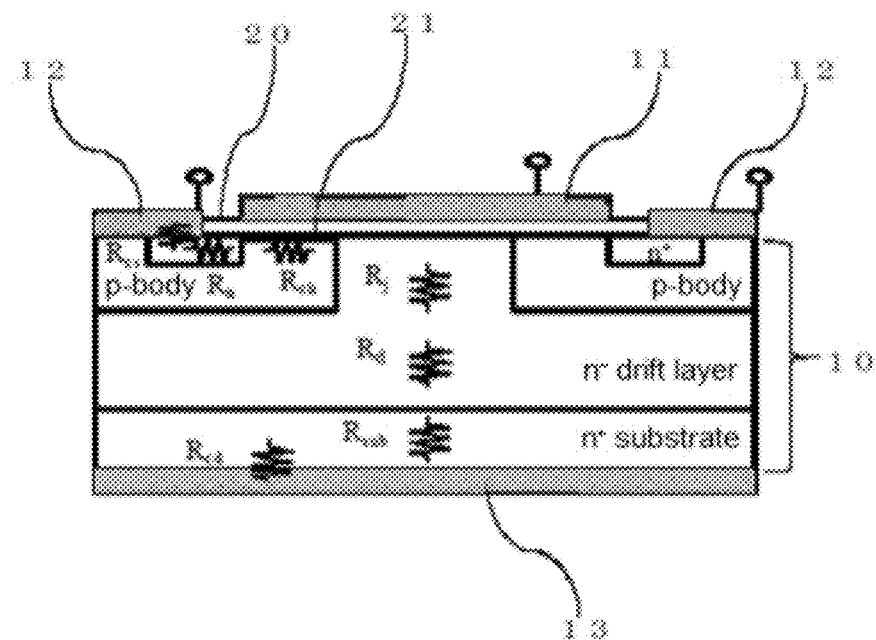
FIG. 1 is a diagram of a DMOSFET as a representative example of a power MOSFET of SiC.

FIG. 1 is a diagram of a MOSFET of SiC. The MOSFET of SiC is such that a gate insulating film 20 is formed and terminals of a gate electrode 11, a source electrode 12 and a drain electrode 13 are provided on a substrate of an SiC semiconductor 10. Here, as shown in FIG. 1, the SiC semiconductor 10 is divided into several layers such as an $n^+$-layer, a p-body layer, an $n^-$-drift layer and an $n^+$-substrate layer. A part which serves as an electrical resistance is present from the source electrode 12 to the drain electrode 13.

For example, there are a resistance value $R_{cs}$ between the source electrode 12 and the $n^+$-layer, a resistance value $R_n$ of the $n^+$-layer, a channel resistance value $R_{ch}$ of an interface 21 between the gate insulating film 20 and the SiC semiconductor 10, a JFET resistance value $R_j$ of the $n^-$ drift layer sandwiched by the p-body layer, a resistance value $R_d$ of the $n^-$-drift layer, a resistance value $R_{sub}$ of the $n^+$-substrate layer and a resistance value $R_{cd}$ between the $n^+$-substrate layer and the drain electrode 13.

Out of these resistance values, the channel resistance value $R_{ch}$ of the interface 21 is particularly dominant.

Figure 2:
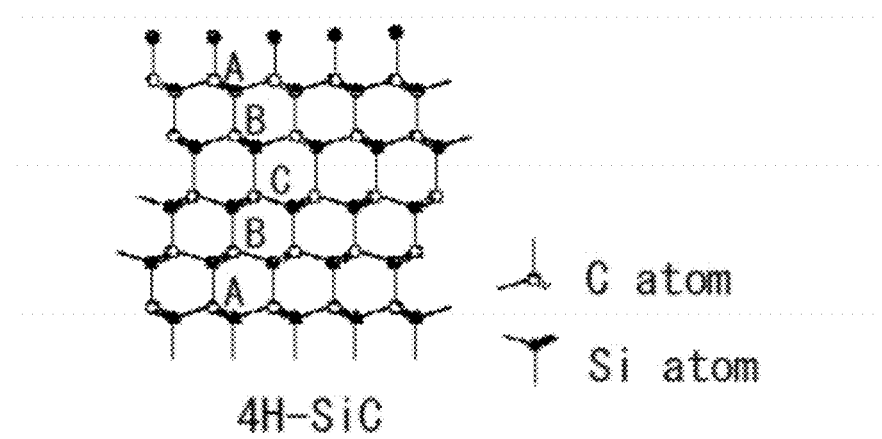
FIG. 2 is a structure diagram of 4H-SiC.
Figure 3:
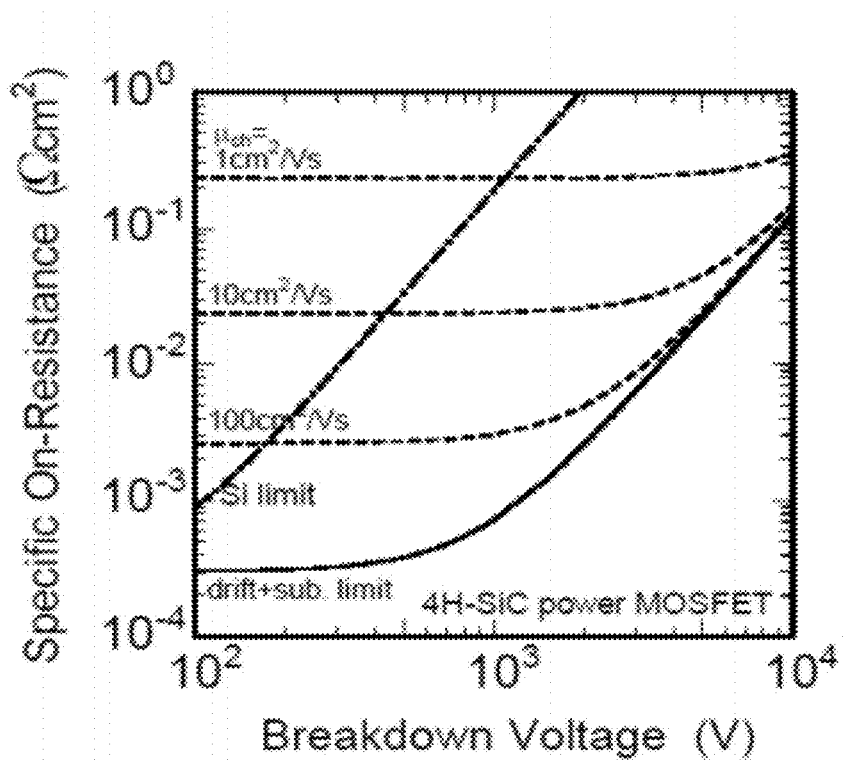
FIG. 3 is a correlation diagram of on-resistance and breakdown voltage of the power MOSFET using channel mobility as a parameter,
FIG. 4 are views showing a manufacturing method of a first example.

As described above, electron mobility in a bulk is as high as 800 to 1000 cm$^2$/Vs in 4H-SiC (structure diagram is shown in FIG. 2), whereas it has been a problem that the channel mobility of the interface of the MOSFET of SiC is as low as 10 cm$^2$/Vs. This is described using FIG. 3. FIG. 3 is a correlation diagram of channel mobility ($\mu_{ch}$) and on-resistance of a transistor, wherein a horizontal axis represents breakdown voltage, i.e. a withstand voltage of a semiconductor element.

In FIG. 3, in the case of 4H-SiC, an on-resistance value for semiconductor elements having the same breakdown voltage is shown to be as low as about 1/1000 in the vicinity of the breakdown voltage 10$^3$ V as compared with the case of Si when silicon (Si limit) and the drift layer and the substrate (drift+sub. limit) of the SiC semiconductor are compared. Further, the on-resistance value is shown to decrease in inverse proportion to the channel mobility ($\mu_{ch}$). Note that, in the SiC semiconductor, the resistance values other than the channel resistance, the resistance of the n-drift layer and that of the $n^+$-substrate layer can be ignored. Particularly, a reduction in the channel resistance value is essential in improving performance of the SiC semiconductor device.

Original high potential of 4H-SiC can be utilized by improving the channel mobility ($\mu_{ch}$) of the interface of the MOSFET of SiC from conventional about 10 cm$^2$/Vs to about 100 cm$^2$/Vs.

In the following example, an SiC semiconductor element in which the channel mobility ($\mu_{ch}$) can be improved to about 90 cm$^2$/Vs and a manufacturing method therefor are described in detail.

Embodiment 1

Figure 4:
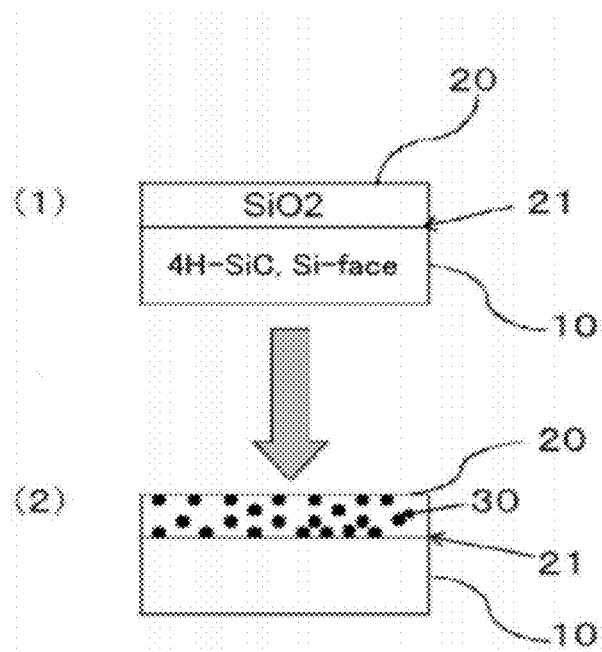
Figure 5:
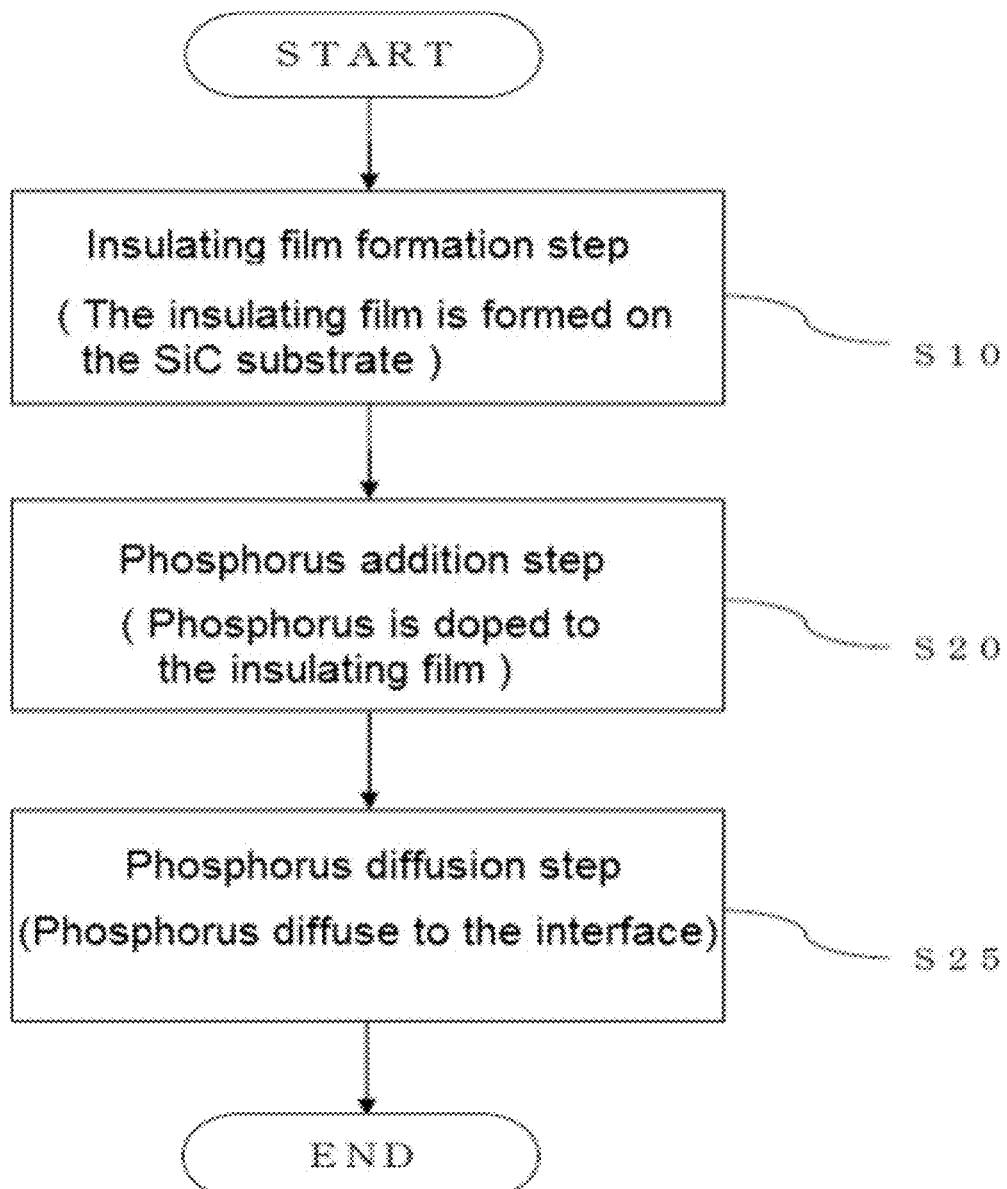
FIG. 5 is a manufacturing flow of the first example,
FIG. 6 are diagrams of manufactured devices for evaluation on interface. state density and channel mobility.

The manufacturing method of a first example is described using FIGS. 4 and 5. FIG. 4 show a state where a gate insulating film 20 is formed on an SiC semiconductor 10 and phosphorus is added to that gate insulating film 20. Here is illustrated an example using an oxide film (SiO$_2$) as an insulating film. In FIG. 4(2), phosphorus 30 has reached up to an interface 21 between the insulating film and SiC. By the phosphorus 30 having reached up to the interface 21 between the insulating film and SiC, interface defects can be reduced and the channel mobility can be improved.

Phosphorus is added to the insulating film on the SiC substrate in a procedure shown in FIG. 5. First, the insulating film is formed on the SiC substrate (S10) and then phosphorus is added to the insulating film (S20). Subsequently, a diffusing step is performed (S25) to cause phosphorus to reliably reach the interface 21 between the insulating film and the SiC.

The procedure of adding phosphorus to the insulating film on the SiC substrate is specifically described. Here is described an example using an oxide film (SiO$_2$) as the insulating film. First, 4H-SiC of an n-type Si-face was subjected to dry oxidation at 1200° C. for 160 minutes to prepare a specimen formed with an oxide film which was an insulating film of 55 nm. A heat treatment was performed on that specimen at 950° C. for 10 minutes in an atmosphere in which 2.25 slm of a nitrogen gas, 1.0 slm of an oxygen gas and a gas obtained by bubbling 0.75 slm of nitrogen in a POCl$_3$ solution kept at 15° C. were mixed. Thereafter, a heat treatment was subsequently performed at the same temperature in a nitrogen atmosphere for 30 minutes. In this way, phosphorus could be added only to the insulating film on SiC. Similarly, phosphorus was added to the insulating film on the SiC substrate with the temperature of the heat treatment set at 1000° C., 1050° C. and 1100° C.

An SiC semiconductor element only subjected to dry oxidation was manufactured as a first comparative example. Specifically, 4H-SiC of an n-type Si-face was subjected to dry oxidation at 1200° C. for 160 minutes to form an oxide film which was an insulating film of 55 nm.

Subsequently, an SiC semiconductor element was manufactured by performing treatments similar to the first example except that the temperatures of the heat treatments were set at temperatures different from those of the first example. Specifically, 4H-SiC of an n-type Si-face was subjected to dry oxidation at 1200° C. for 160 minutes to prepare a specimen formed with an oxide film which was an insulating film of 55 nm. A heat treatment was performed on that specimen at 900° C. for 10 minutes in an atmosphere in which 2.25 slm of a nitrogen gas, 1.0 slm of an oxygen gas and a gas obtained by bubbling 0.75 slm of nitrogen in a POCl$_3$ solution kept at 15° C. were mixed. Thereafter, a heat treatment was subsequently performed at the same temperature in a nitrogen atmosphere for 30 minutes.

Figure 6:
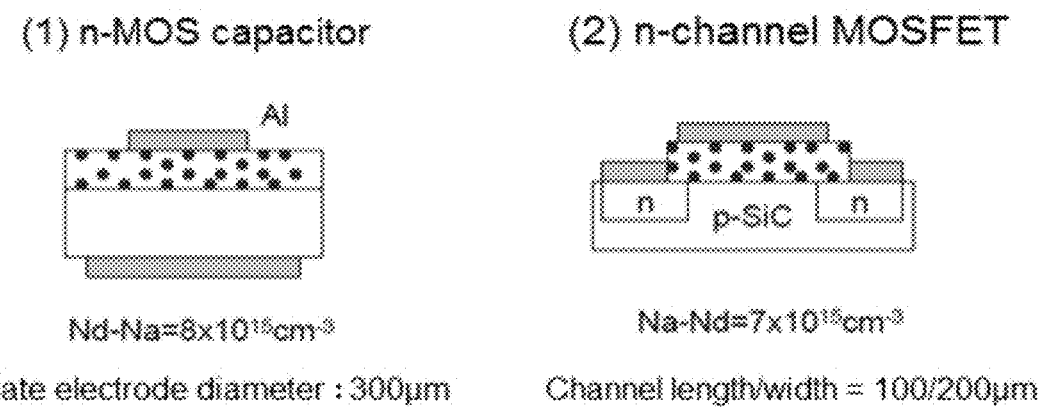

FIG. 6 show manufactured devices. These are diagrams of the manufactured devices for evaluation on the interface state density and the channel mobility.

Formation of a gate electrode is described. The gate electrode may be made of any of materials including metals such as aluminum, tungsten and molybdenum and N-type polysilicon and P-type polyilicon. Here, aluminum was used as the gate electrode. Further, a silicide film such as a WSi$_2$ film, a MoSi$_2$ film or a TiSi$_2$ film may be formed on this gate electrode. Further, aluminum was formed as a backside electrode thereafter.

The manufacturing of a MOS capacitor shown in FIG. 6(1) is described. First, after 4H-SiC (impurity concentration Nd—Na=8×10$^{15}$ cm$^{-3}$) was first subjected to normal RCA washing, an oxide film, which was an insulating film, was formed. Thereafter, the formed insulating film was removed by hydrofluoric acid of 5%. Thereafter, a gate insulating film was formed and then a heat treatment (PMA: Post Metallization Anneal) was performed in nitrogen at 400° C. for 30 minutes to manufacture the MOS capacitor.

Next, the manufacturing of an n-channel MOSFET shown in FIG. 6(2) is described. The n-channel MOSFET having a channel length/width=100/200 μm was manufactured using p-type 4H-SiC (impurity concentration Na—Nd=7×10$^{15}$ cm$^{-3}$) by a similar gate insulating film formation technique and a heat treatment thereafter.

Figure 7:
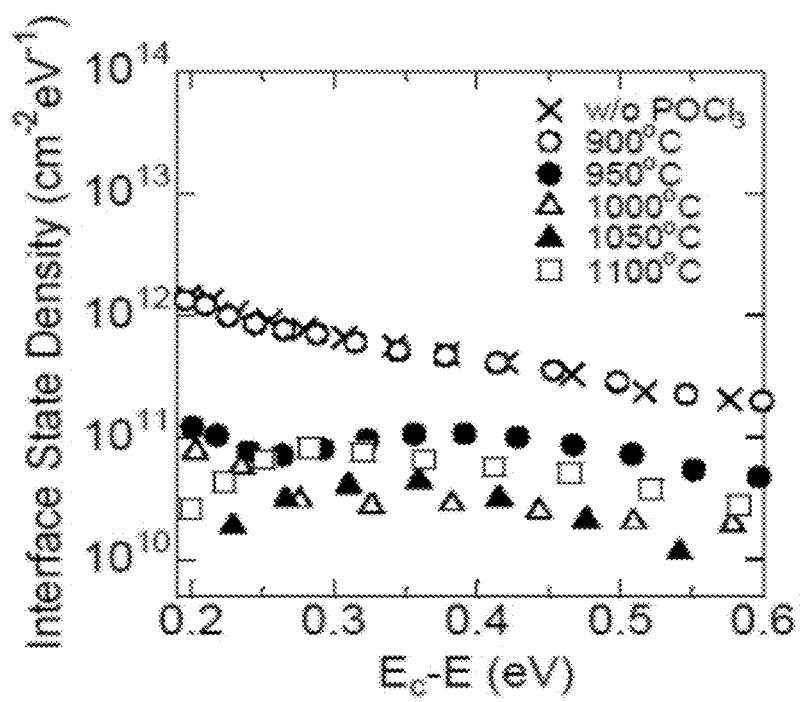
FIG. 7 is a graph showing measurement results on interface state density.

FIG. 7 is a graph showing measurement results on the interface state density. It can be understood from FIG. 7 that the interface state density was lower in those on which the heat treatment was performed at 950° C., 1000° C., 1050° C. and 1100° C. The one on which the heat treatment was performed at 900° C. shows a result similar to the one subjected only to dry oxidation, and an effect of reducing the interface state density could not be confirmed. Contrary to this, the interface state densities of those on which the heat treatment was performed in a temperature range of 950 to 1100° C. could be reduced by one digit or more, i.e. reduced to $1\times10^{11}$ cm$^{-2}$ eV$^{-1}$ or less to a mid-range of $1\times10^{10}$ cm$^{-2}$ eV$^{-1}$.

Figure 8:
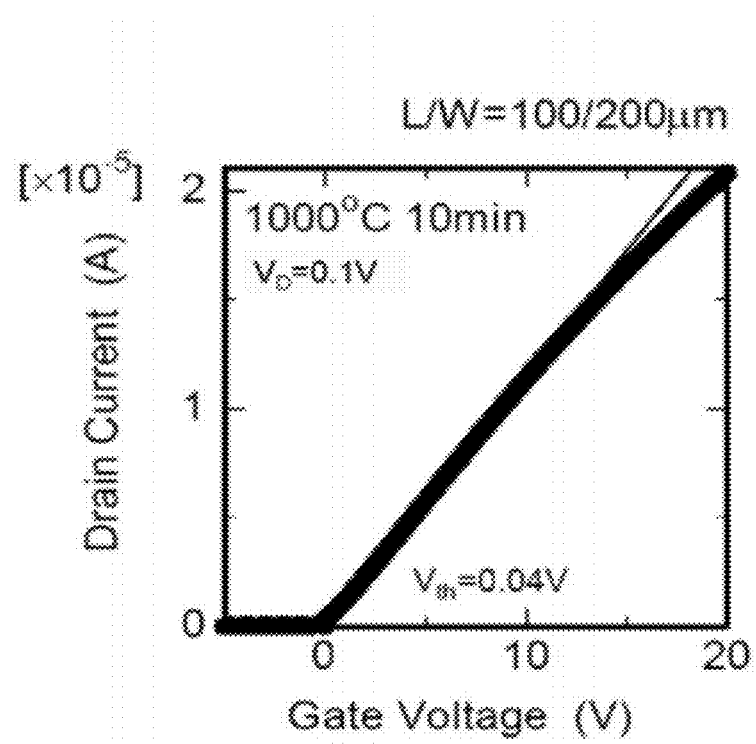
FIG. 8 is a graph showing a characteristic of an n-MOSFET.
Figure 9:
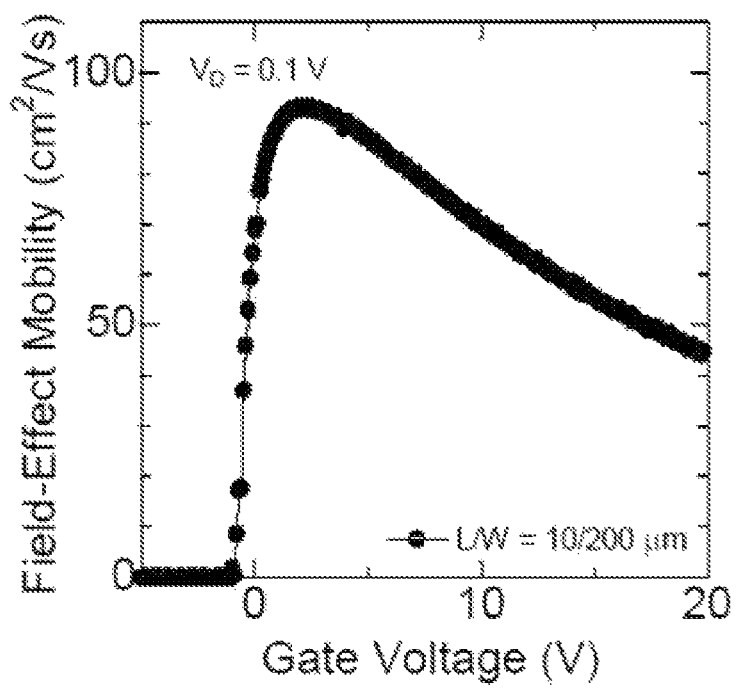
FIG. 9 is a graph showing a measurement result 1 of the channel mobility.
Figure 10:
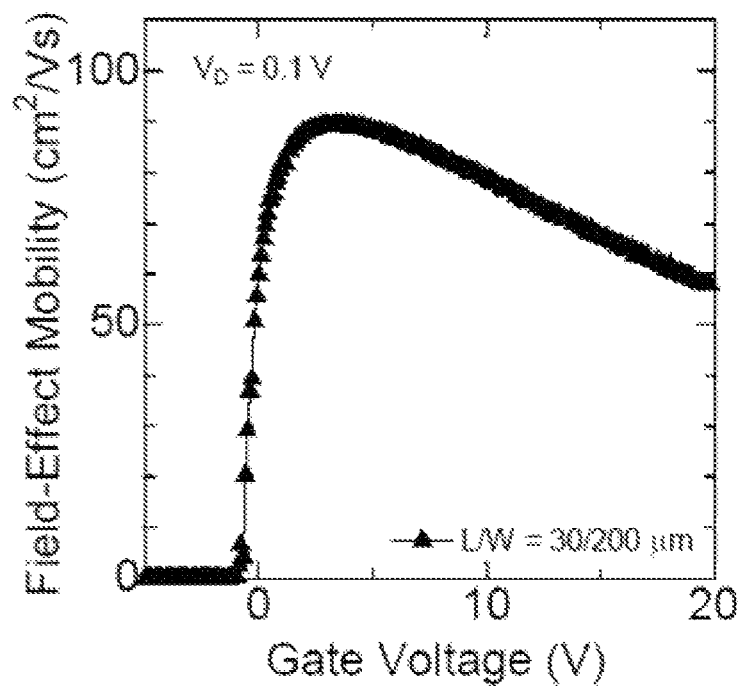
FIG. 10 is a graph showing a measurement result 2 of the channel mobility.
Figure 11:
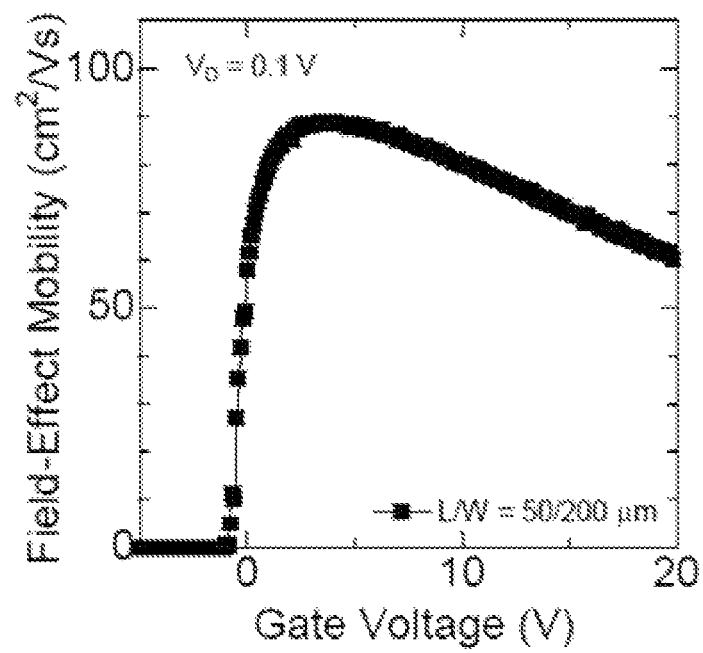
FIG. 11 is a graph showing a measurement result 3 of the channel mobility.
Figure 12:
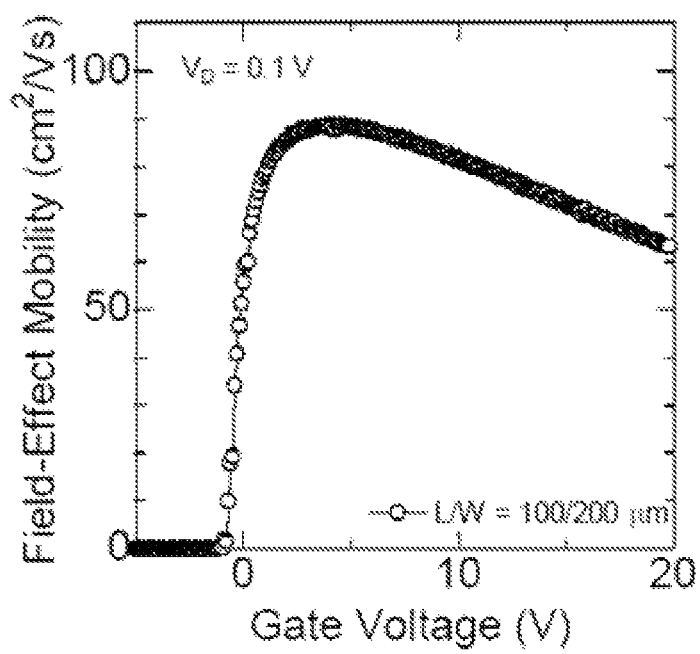
FIG. 12 is a graph showing a measurement result 4 of the channel mobility.

FIG. 8 shows a characteristic of an n-MOSFET (channel length/width L/W=100/200 μm) on which a heat treatment was performed at 1000° C. for 10 minutes and in which phosphorus was added to an oxide film; which was a gate insulating film of SiC, using the manufacturing method of the first example. As shown in FIG. 8, this characteristic is a normally-off characteristic and shows a state where a threshold voltage ($V_{th}$) is 0.04 V, and a drain current linearly increases as a gate voltage is applied.

Next, FIGS. 9 to 12 are graphs showing channel mobility for a MOSFET of SiC on which a heat treatment was performed at 1000° C. for 10 minutes using the manufacturing method of the first example. The channel length/width (L/W) of the MOSFET is 10/200 μm in FIG. 9, 30/200 μm in FIG. 10, 50/200 μm in FIG. 11 and 100/200 μm in FIG. 12.

Figure 13:
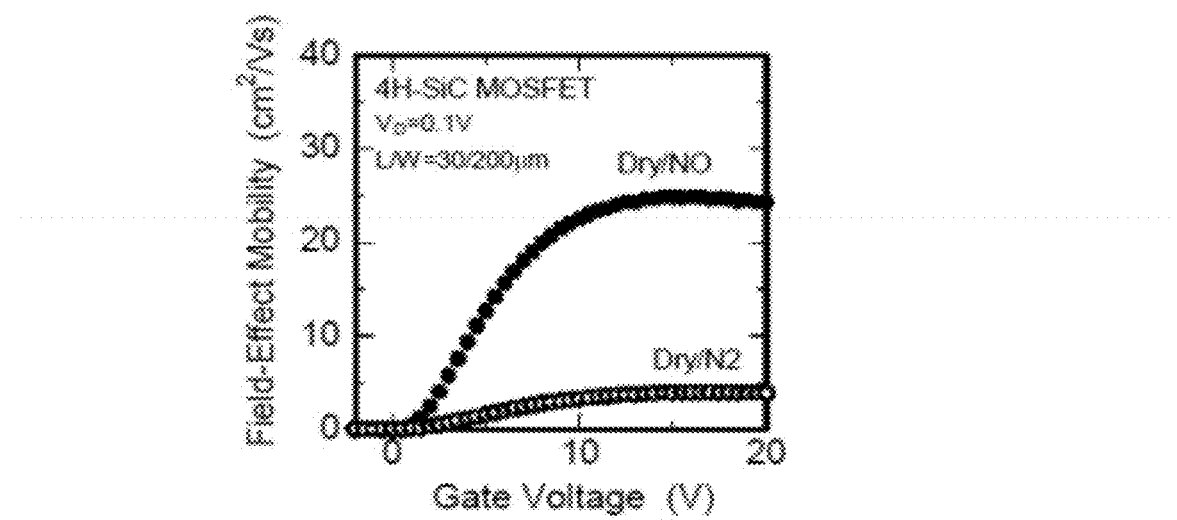
FIG. 13 is a graph showing channel mobility characteristics of a dry oxide film as a conventional technology.

According to FIGS. 9 to 12, the channel mobilities of the manufactured MOSFETs of SiC are all improved up to 90 cm$^2$/Vs. As comparative data, the channel mobility of a MOSFET subjected to dry oxidation in which phosphorus is not added to an oxide film which is a gate insulating film is shown in FIG. 13. In FIG. 13, Dry/N$_2$ is the one on which a heat treatment was performed in a nitrogen atmosphere after dry oxidation and the channel mobility in this case is 4 cm$^2$/Vs. Further, Dry/NO is the one on which a heat treatment was performed using a nitric oxide (NO) gas after dry oxidation (oxide film was nitrided) and the channel mobility in this case is 25 cm$^2$/Vs. Note that the channel length/width (L/W) of the MOSFET is 30/200 μm.

This leads to an understanding that the channel mobility is generally 4 to 25 cm$^2$/Vs in the case of dry oxidation which is a conventional technology, but is drastically improved up to 90 cm$^2$/Vs by introducing phosphorus into the gate insulating film.

In this way, the channel mobility of the MOSFET can be improved regardless of the channel size (channel length/width) by using the manufacturing method of the first example and, with this, the on-resistance value can be reduced in inverse proportion to the channel mobility.

Figure 14:
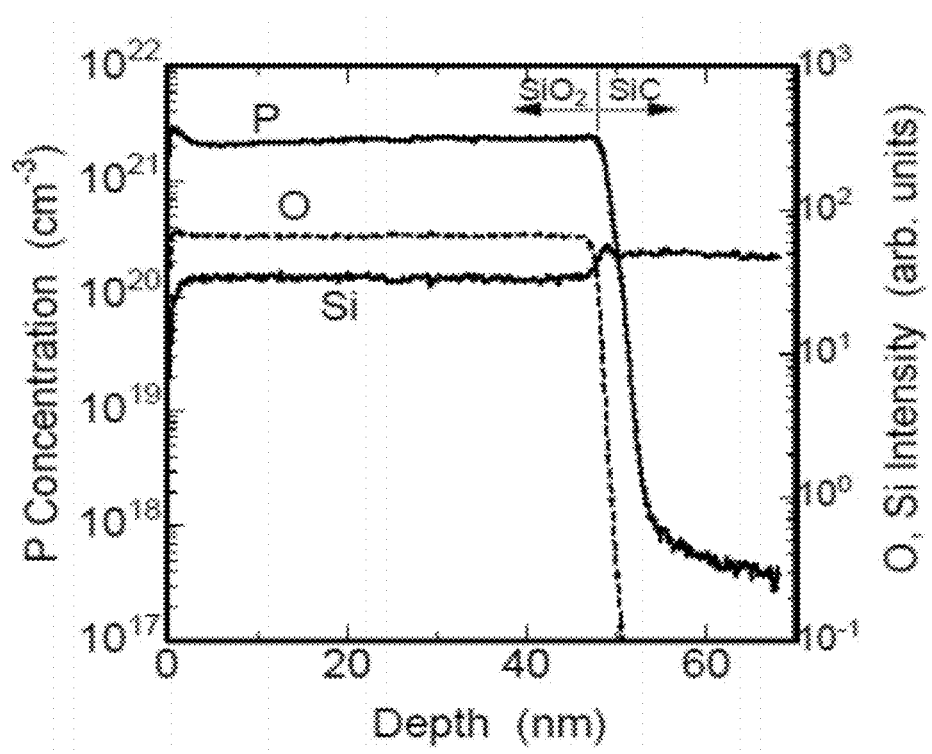
FIG. 14 is a graph showing a phosphorus concentration in a film thickness direction of an oxide film formed in the first example.

FIG. 14 shows a concentration distribution of phosphorus atoms in a film thickness direction of the oxide film manufactured in the first example. It can be understood from a graph of FIG. 14 that a phosphorus concentration is uniformly distributed at a concentration of $2\times10^{21}$ cm$^{-3}$ up to the interface with SiC. Note that although a tiny amount of phosphorus looks to be present in SiC in FIG. 14, it only looks so because a measurement was conducted from a high concentration side and there is no phosphorus added to SiC by the heat treatment.

Figure 15:
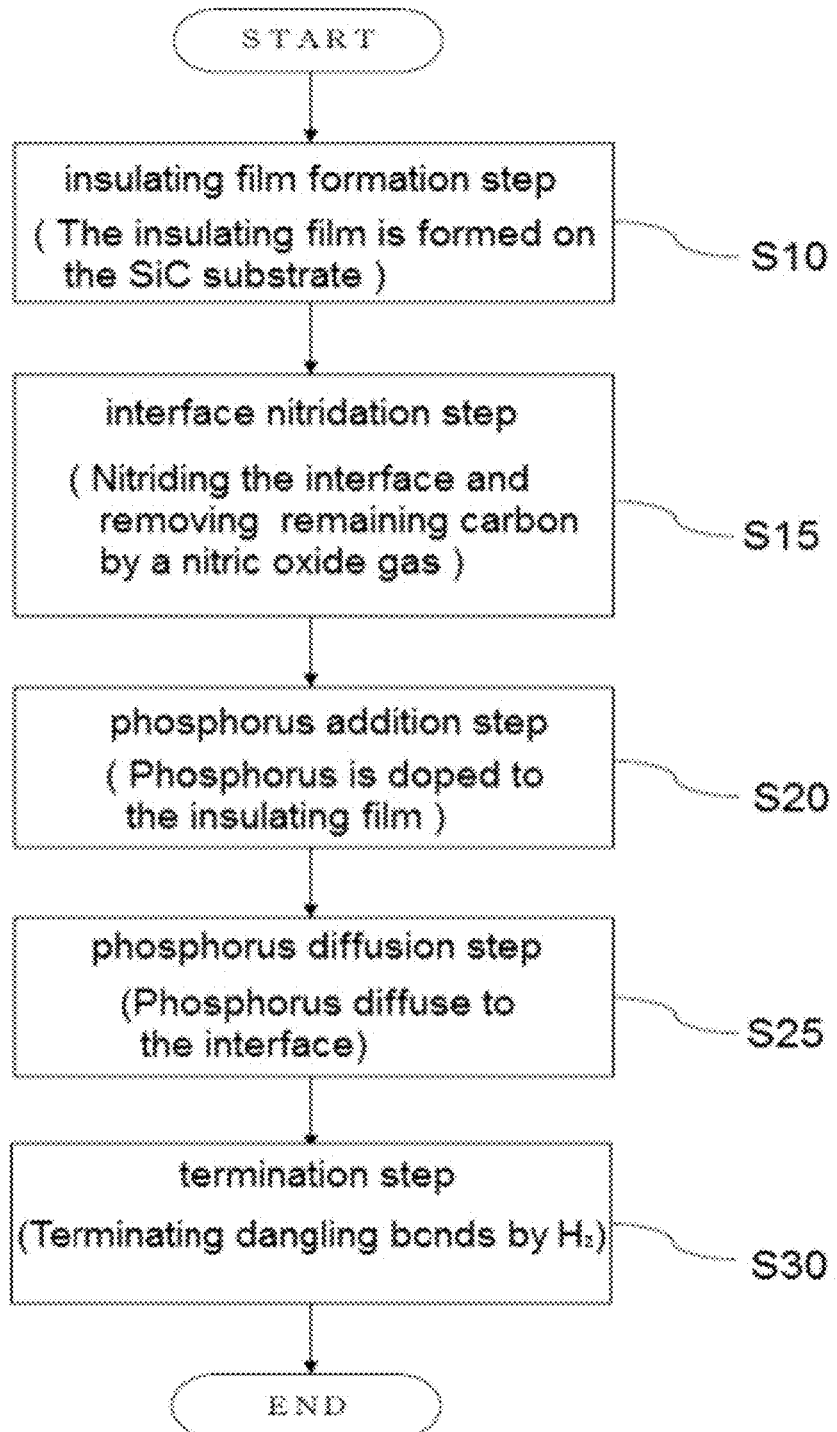
FIG. 15 is a manufacturing flow of another example.

Further, as a method for reducing interface defects to improve the channel mobility, an interface nitriding step (S15) of nitriding the interface and removing remaining carbon by a nitric oxide gas (e.g. NO gas) and a terminating step (S30) of terminating dangling bonds by H$_2$ anneal are added to the process of the first example as shown in a flow of FIG. 15.

INDUSTRIAL APPLICABILITY

The present invention is useful for MIS(MOS) field-effect transistors (MIS(MOS)FETs) used in switches of inverters of electric vehicles, hybrid vehicles, railroads, home electronics and power systems. Further, the present invention can also be utilized for insulated gate bipolar transistors (IGBTs) used in a higher-voltage region than MIS(MOS)FETs. Furthermore, the present invention can be applied to surface passivation films of gate turn-off (GTO) thyristors, bipolar junction transistors (BJTs), junction field-effect transistors (JFETS), P(i)N diodes, Schottky barrier diodes (SBDs) and the like.

DESCRIPTION OF SYMBOLS

10. SiC semiconductor
11. Gate electrode
12. Source electrode
13. Drain electrode
20. Gate insulating film
21. Interface
30. Phosphorous

What is claimed is:

1. An SiC semiconductor element, comprising at least:
an SiC semiconductor substrate; and
an insulating film in contact with the substrate,
the insulating film containing phosphorus,
the density of phosphorus in the insulating film is $1\times10^{21}$ cm$^{-3}$ or more,
phosphorus is present in an interface between the insulating film and the SiC semiconductor substrate,
the interface state density of an interface between the SiC semiconductor substrate and the insulating film is $1\times10^{11}$ cm$^{-2}$ eV$^{-1}$ or less when energy from a conduction band edge is in a range of 0.2 to 0.6 eV.

2. The SiC semiconductor element according to claim 1, wherein phosphorus in the insulation film comes from the phosphorus compound that bubbling is possible at normal temperature.

3. The SiC semiconductor element according to claim 1, wherein the channel mobility of the semiconductor element is 85 cm$^2$/Vs or more.

4. The SiC semiconductor element according to claim 1, wherein phosphorus is added to the insulating film by a heat treatment and an impurity concentration of the SiC semiconductor substrate does not change.

5. The SiC semiconductor element according to claim 1, wherein a phosphorus concentration is uniformly distributed up to the interface with the SiC semiconductor substrate in a film thickness direction in the insulating film.

6. The SiC semiconductor element according to claim 1, wherein the insulating film is used as a gate insulating film.

7. The SiC semiconductor element according to claim 1, wherein the insulating film is used as a surface passivation film.

8. A manufacturing method for an SiC semiconductor element, comprising:
an insulating film forming step of forming an insulating film on a semiconductor substrate made of SiC; and
a phosphorus adding step of adding phosphorus to the insulating film by a heat treatment,
the phosphorus adding step is performed by performing the heat treatment at a temperature of 800 to 1100° C.,
the phosphorus source is the phosphorus compound that bubbling is possible at normal temperature.

9. The manufacturing method according to claim 8, further comprising:
an interface nitriding step of nitriding an interface and removing remaining carbon using a nitric oxide gas for the formed insulating film; and
a terminating step of terminating dangling bonds using hydrogen anneal.

10. The manufacturing method according to claim 8, comprising an inert gas annealing step of performing annealing using an inert gas after the phosphorus adding step.

11. The manufacturing method according to claim 10, wherein the phosphorus adding step is performed by performing the heat treatment on the insulating film at a temperature of 800 to 1100° C. in a mixed gas atmosphere of oxygen and an inert gas by bubbling a phosphoryl chloride (POCl$_3$) solution and the inert gas annealing step is performed at a temperature of 950 to 1100° C.

12. The manufacturing method according to claim 10, wherein the inert gas is a nitrogen gas or an argon gas.

13. The manufacturing method according to claim 8, wherein the phosphorus adding step is performed by performing the heat treatment on the insulating film at a temperature of 950 to 1100° C. in a mixed gas atmosphere of oxygen and an inert gas by bubbling a phosphoryl chloride (POCl$_3$) solution.

14. The manufacturing method according to claim 8, wherein the density of phosphorus in the insulating film is $1 \times 10^{21}$ cm$^{-3}$ or more.

15. The manufacturing method according to claim 8, wherein the interface state density of an interface between the SiC semiconductor substrate and the insulating film is $1 \times 10^{11}$ cm$^{-2}$ eV$^{-1}$ or less when energy from a conduction band edge is in a range of 0.2 to 0.6 eV.

16. The manufacturing method according to claim 8, wherein phosphorus is present in an interface between the insulating film and the SiC semiconductor substrate.

17. The manufacturing method according to claim 8, wherein an impurity concentration of the SiC semiconductor substrate does not change.

18. The manufacturing method according to claim 8, wherein a phosphorus concentration is uniformly distributed up to the interface with the SiC semiconductor substrate in a film thickness direction in the insulating film.

19. The manufacturing method according to claim 8, further comprising using the insulating film as a gate insulating film.

20. The manufacturing method according to claim 8, further comprising using the insulating film as a surface passivation film.

* * * * *